United States Patent

Narita

Patent Number: 5,724,219
Date of Patent: Mar. 3, 1998

[54] ELECTROSTATIC PROTECTION CIRCUIT COMPRISING PLURALITY OF PROTECTIVE ELEMENTS

[75] Inventor: Kaoru Narita, Tokyo, Japan

[73] Assignee: NEC Corporation, Tokyo, Japan

[21] Appl. No.: 655,188

[22] Filed: May 30, 1996

[30] Foreign Application Priority Data

May 30, 1995 [JP] Japan .................. 7-155273

[51] Int. Cl.$^6$ ........................................ H02H 3/22
[52] U.S. Cl. .................. 361/111; 361/56; 361/58
[58] Field of Search ................. 361/56, 58, 111, 361/91

[56] References Cited

U.S. PATENT DOCUMENTS

| | | | |
|---|---|---|---|
| 4,807,081 | 2/1989 | Crofts et al. | 361/56 |
| 5,079,612 | 1/1992 | Takamoto et al. | 361/91 |
| 5,157,573 | 10/1992 | Lee et al. | 361/56 |
| 5,321,575 | 6/1994 | Shilo | 361/56 |

*Primary Examiner*—Fritz Fleming
*Assistant Examiner*—Michael Sherry
*Attorney, Agent, or Firm*—Sughrue, Mion, Zinn, Macpeak & Seas, PLLC

[57] ABSTRACT

A semiconductor device according to this invention comprises a first power supply (Vcc) wiring, a second power supply (Gnd) wiring, a first, a second and a third protective elements (3-1, 3-2 and 3-3), a first connecting wiring which connects in common one ends of the first, the second and the third protective elements, a second connecting wiring which connects the other ends of the first, the second and the third protective elements, and a third connecting wiring which connects the first connecting wiring and the first power supply wiring. The third connecting wiring has a resistance which is higher than that of the first connecting wiring.

3 Claims, 9 Drawing Sheets

ELECTROSTATIC PROTECTION CIRCUIT COMPRISING PLURALITY OF PROTECTIVE ELEMENTS

BACKGROUND OF THE INVENTION

1. Field of the Invention

The present invention relates to an electrostatic protection circuit, and more particularly, to an electrostatic protection circuit comprising a plurality of protective elements.

2. Description of the Prior Art

Figure 1:
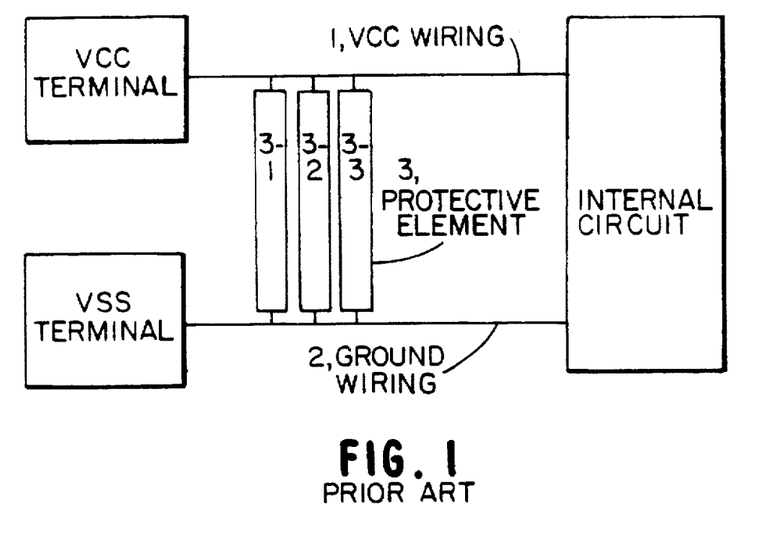
FIG. 1 is a circuit diagram showing the configuration of a conventional electrostatic protection circuit.

A semiconductor integrated circuit has a protection circuit to prevent the supply of an overvoltage such as that of an electrostatic pulse to an internal circuit. As shown in FIG. 1, the semiconductor integrated circuit is equipped with a plurality of protective elements 3 installed between a Vcc wiring 1 and a Gnd wiring 2 that are connected to the internal circuit. The protective elements 3 are OFF state when there is supplied a normally used voltage, but they are ON state when an electrostatic pulse is applied between the Vcc wiring 1 and the Gnd wiring 2, to discharge the electrostatic pulse. Since the plurality of protective elements 3 are arranged in parallel, the discharge current is distributed among the protective elements to reduce the loads on respective elements.

Figure 2:
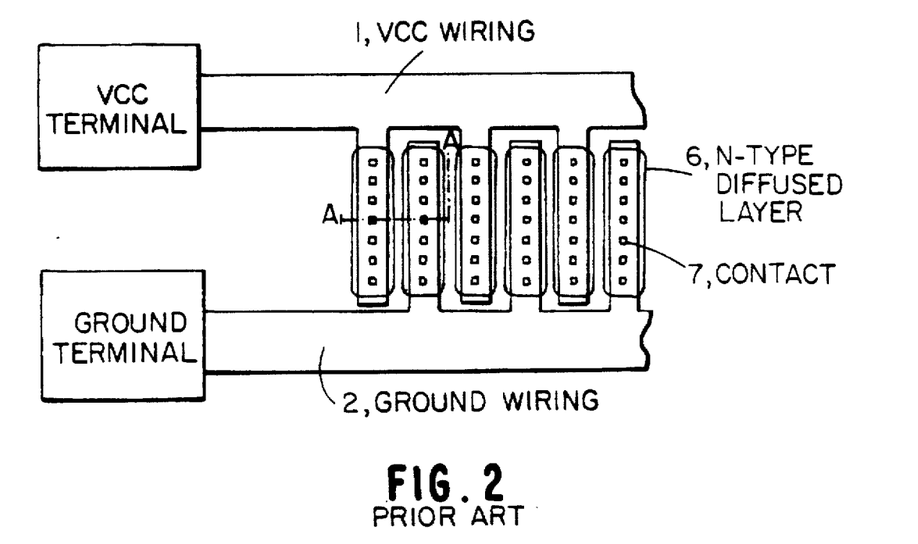
FIG. 2 is a diagram showing a plane pattern of the protective elements in FIG. 1.
Figure 3:
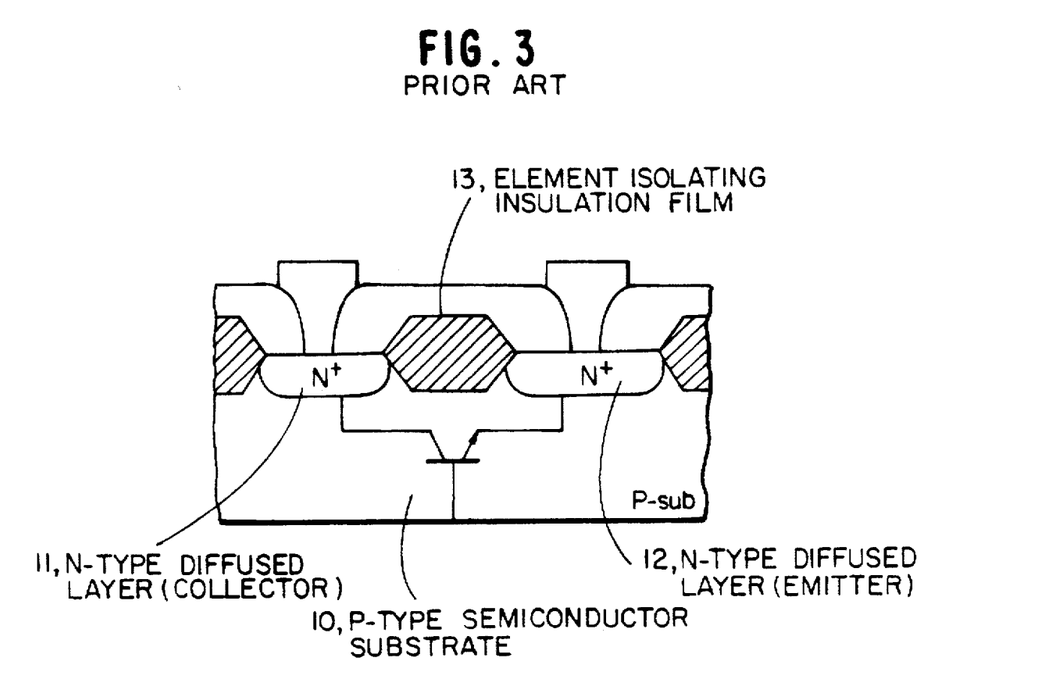
FIG. 3 is a sectional view along the line A—A in FIG. 2.

FIG. 2 shows a plane pattern of the protective element section in FIG. 1, and FIG. 3 shows a sectional view along the line A—A in FIG. 2. An N-type diffused layer (collector) 11 and an N-type diffused layer (emitter) 12 face with each other at a small interval (about 1 μm) with an element isolating insulation film 13 in between. An NPN transistor is formed by the diffused layers 11 and 12, and a P-type semiconductor substrate 10. This NPN transistor is OFF state when a normal voltage is supplied, but is ON state when a voltage (about 15 V) exceeding the backward withstand voltage of the P-N junction is applied between the N-type diffused layer (collector) 11 and the P-type semiconductor substrate 10.

The plurality of protective elements (3-1, 3-2 and 3-3) in the above are formed to have the same structure so as to give them an identical turn-on resistance. However, there is generated an irregularity in the on-resistance of the protective elements due to problems related to the manufacturing process or the like. The dispersion in the on-resistance gives rise to a problem in that all the protective elements cannot be operated equally. For example, if the on-resistance of the protective element 3-1 is lower by 20% than that of the other protective elements, the discharge current of the electrostatic pulse that flows in the protective element 3-1 is higher by 20% than the current that flows in the other protective elements. Therefore, the protective element 3-1 is more vulnerable compared with the other elements.

When the protection circuit is to be designed by taking the dispersion in the on-resistance of the protective elements into account, the resistance to dielectric breakdown of each protective element must be augmented. As a result, there arises a problem that the area of the protective element has to be increased.

BRIEF SUMMARY OF THE INVENTION

1. Object of the Invention

It is therefore the object of this invention to provide an electrostatic protection circuit by which the difference in the discharge currents flowing in respective protective elements can be minimized even if there exists dispersion in the on-resistance of a plurality of protective elements.

2. Summary of the Invention

A semiconductor device comprises a first power supply wiring, a second power supply wiring, a first, a second and a third protective elements arranged in parallel, a first connecting wiring which connects in common each one end of the first, second and third protective elements, a second connecting wiring which connects each of the other end of the first, second and third protective elements to the second power supply wiring, and a third connecting wiring which connects the first connecting wiring to the first power supply wiring. The third connecting wiring has a resistance larger than that of the first connecting wiring.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 4:
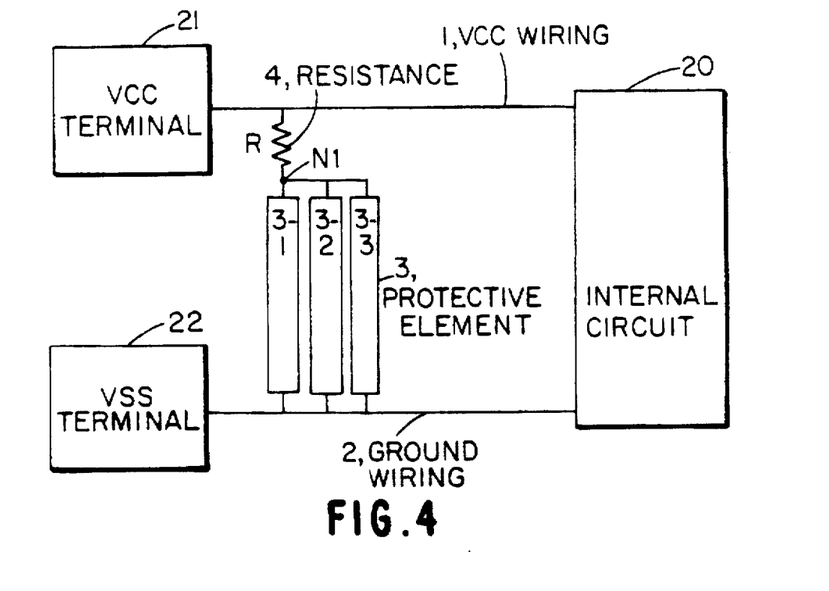
FIG. 4 is a circuit diagram showing a first embodiment of this invention.

Referring to FIG. 4, the first embodiment of this invention will be described. A Vcc terminal 21 is connected to an internal circuit 20 through a Vcc wiring 1 and a Vss terminal 22 is connected to the internal circuit 20 through a Gnd wiring 2. An electrostatic protection circuit comprises a plurality of protective element (3-1, 3-2 and 3-3) with identical configuration. One ends of respective protective elements 3 are connected in common to a node N1, while their other ends are connected independently to the Gnd wiring 2. The node N1 is connected to the Vcc wiring 1 via a resistor 4. The protective elements 3 are in the nonconductive state when potentials used for normal operation are supplied to the Vcc wiring 1 and the Gnd wiring 2, and becomes conductive only when an overvoltage is applied between the Vcc wiring 1 and the Gnd wiring 2. The resistor 4 is required to have a resistance greater than at least that possessed by the commonly connected portion N1, and more specifically, it is desirable to be in the range of 0.3 to 2 Ω.

In the prior art shown in FIG. 1, assume that the on-resistance of the protective elements 3-1 and 3-2 is Ron and the on-resistance of the protective element 3-3 is Ron', and that a pulse with a peak voltage V is applied between the Vcc wiring 1 and the Gnd wiring 2. Since the peak powers consumed by the respective protective elements are $P_1=P_2=V^2/\text{Ron}$ and $P_3=V^2/\text{Ron}'$, their difference is $$\Delta P_1 = V^2 \left( \frac{1}{\text{Ron}'} - \frac{1}{\text{Ron}} \right).$$

On the other hand, the parallel resistance $R_2$ of the protective elements 3-1 to 3-3 of this invention shown in FIG. 4 is given by $$R_2 = \frac{\text{Ron Ron}'}{2\text{Ron}' + \text{Ron}},$$

where R is the resistance of the resistor 4 in FIG. 4, and the voltage V' applied to the protective elements 3 is $$V' = \frac{R2\, V}{R + R2}$$

Hence, the corresponding difference between the peak powers is given by $$\Delta P_2 = V' \left( \frac{1}{\text{Ron}'} - \frac{1}{\text{Ron}} \right) = \frac{R2^2\, V^2}{(R+R2)^2} \left( \frac{1}{\text{Ron}'} - \frac{1}{\text{Ron}} \right).$$

Therefore, the ratio of the peak power difference $\Delta P_2$ between the protective elements of this invention to that $\Delta P_1$ of the prior art is $$\alpha = \Delta P2/\Delta P1 = \frac{R_2^2}{(R+R_2)^2}$$

Now, suppose that the on-resistance of the protective element 3-3 is lower than the on-resistance of the other protective elements (3-1 and 3-2) due to manufacturing conditions or other causes, and they are given by Ron=4 Ω and Ron'=3 Ω.

If R=0.4 Ω in this invention, then $R_2=4\times3/(6+4)=12/10=1.2$ so that α is given by $$\alpha = \frac{(1.2)^2}{(0.4+1.2)^2} = 0.56 = 56\%.$$

This means that the difference between the peak powers of this invention can be suppressed to 56% of that of the prior art.

In FIG. 4, the resistor 4 is inserted between the protective elements 3 and the Vcc wiring 1, but entirely the same effect can be obtained by installing the resistor between the protective elements 3 and the Gnd wiring 2.

Figure 5:
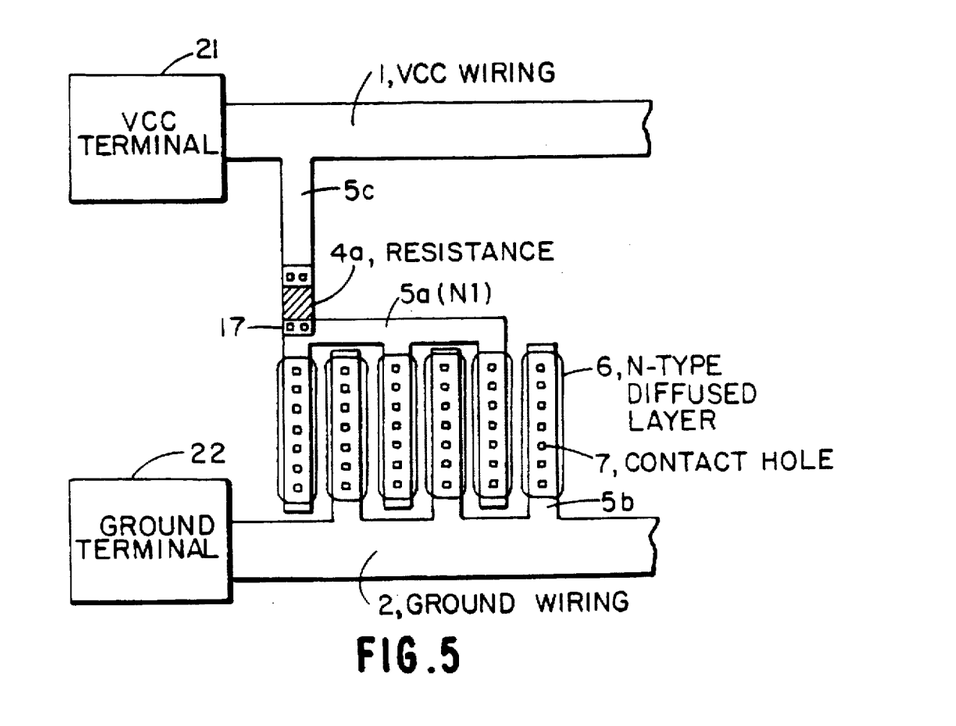
FIG. 5 is a diagram showing a first specific example of the plane pattern in FIG. 4.

Referring to FIG. 5, a specific example of the circuit shown in FIG. 4 will be described. In this example, the protective element comprises a parasitic bipolar transistor the same as that in the protective element described in FIGS. 2 and 3. Namely, a plurality of N-type diffused layers 6 formed in parallel on a P-type semiconductor substrate are connected respectively to aluminum wirings 5a and 5b in an upper layer by means of contact holes 7. The aluminum wirings 5a are connected in common, and the commonly connected portion corresponds to the node N1 in FIG. 4. The Vcc wiring 1 is formed of aluminum and is connected to an aluminum wiring 5c. The Gnd wiring 2 is formed of aluminum and is connected to the aluminum wiring 5b. A resistor 4a is a wiring layer of tungsten silicide formed on a layer below the aluminum layers 5a and 5b. The resistor 4a is connected to the aluminum wirings 5a and 5c via contact holes 17. Here, the width of the Vcc wiring 1 and the Gnd wiring 2 is 20 μm, the width of the aluminum wirings 5a, 5b, and 5c is 10 μm, and the resistance of the resistor 4a is about 0.4 Ω. The resistance of the resistor 4a is required to be greater than at least the resistance of the aluminum wiring 5a that connects in common one ends of respective protective elements. The resistor 4a may be made of titanium silicide.

Figure 6:
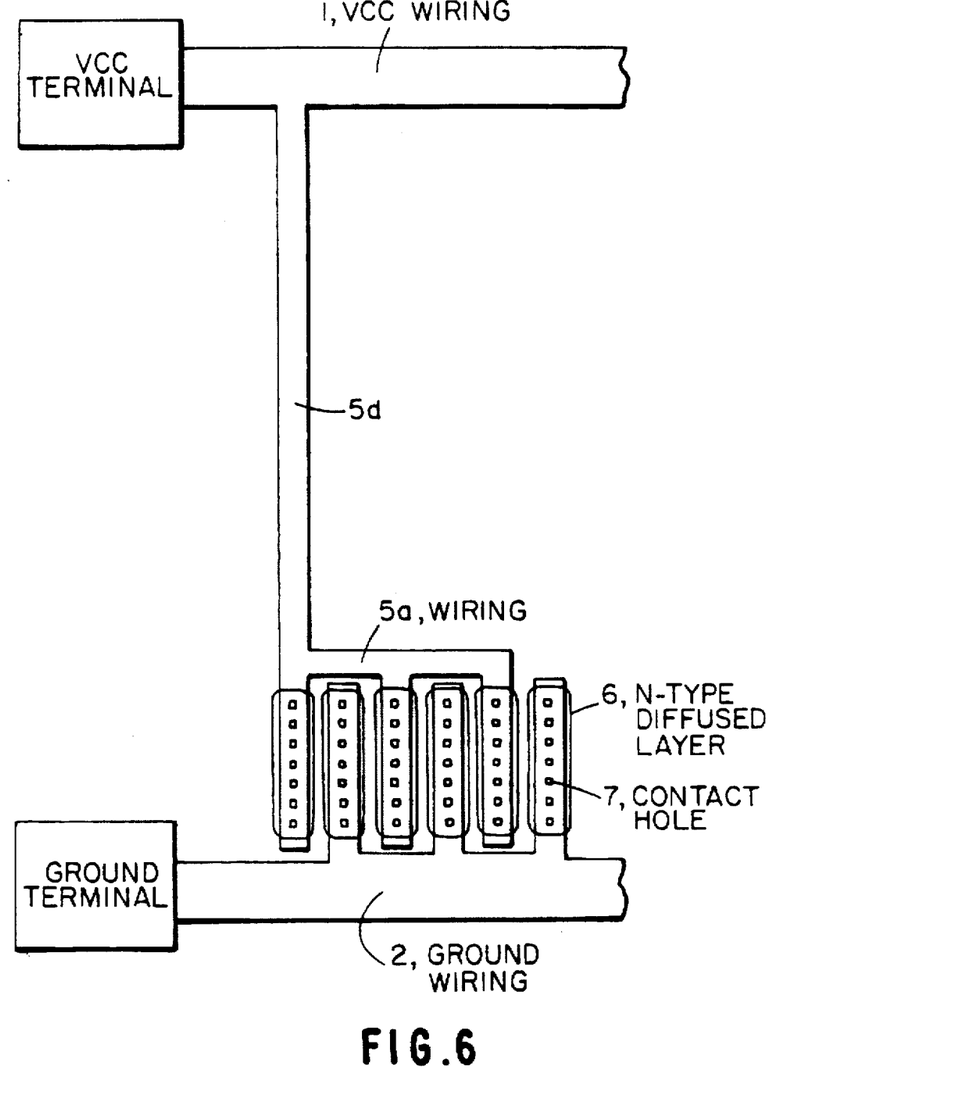
FIG. 6 is a diagram showing a second specific example of the plane pattern in FIG. 4.
Figure 7:
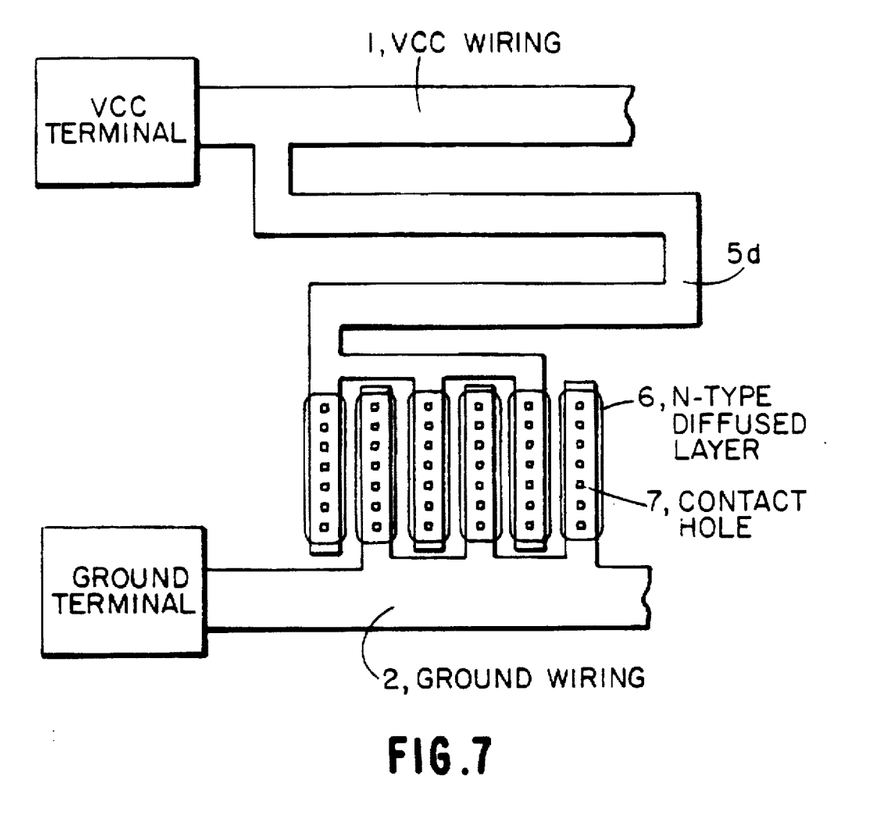
FIG. 7 is a diagram showing a third specific example of the plane pattern in FIG. 4.

Referring to FIG. 6 and FIG. 7, further specific examples of the first embodiment shown in FIG. 4 will be described. The difference between FIG. 6 and FIG. 7, and FIG. 5 resides in the point that a resistor 4a formed of tungsten silicide is provided in FIG. 5, whereas no resistive element is provided in the examples shown in FIG. 6 and FIG. 7. That is, in the latter examples the Vcc wiring 1 and the aluminum wirings 5a are connected Via an aluminum wiring 5d with length of about 8 to 10 μm. If one assumes that the sheet resistivity of the aluminum wiring is 0.065 Ω/square, the resistance of the wiring 5d is estimated to be about 0.5 Ω, being larger than the resistance of the commonly connected portion of the aluminum wirings 5a, so that the wiring 5d can safely function as a substitute for a resistive element.

In the above estimation of the peak powers for the protective elements in FIG. 4, the calculation was carried out by neglecting the resistance of the aluminum wirings. In reality, however, the aluminum wirings 5a, for example, in FIG. 5 have resistances. Therefore, if the node N1 is situated in the vicinity of the protective element 3-1 as shown in FIG. 4, resistances corresponding to the wiring components will have to be added to the resistances of the protective elements 3-2 and 3-3 compared with the protective element 3-1. Accordingly, it becomes necessary to reduce the effect of the wiring resistances.

Figure 8:
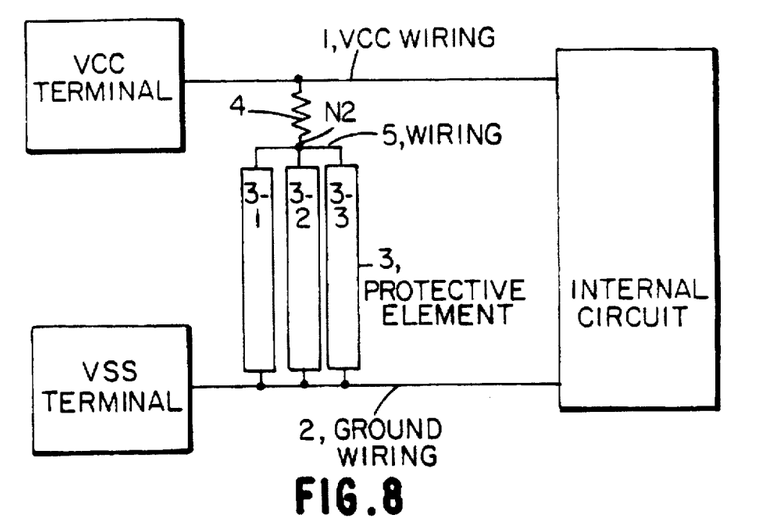
FIG. 8 is a circuit diagram showing a second embodiment of this invention.

FIG. 8 is a circuit diagram showing the second embodiment of this invention in which the effect of the wiring resistances is minimized. The difference of this embodiment from the first embodiment in FIG. 4 resides in the fact that a node N2 where the resistor 4 is connected to the wiring 5 is arranged to be almost at the middle of the wiring 5. With this configuration the resistances due to the wiring 5 to be added to the protective element 3-1 and the protective element 3-3 are equal, and the effect of the wiring resistances becomes small as a whole.

Figure 9:
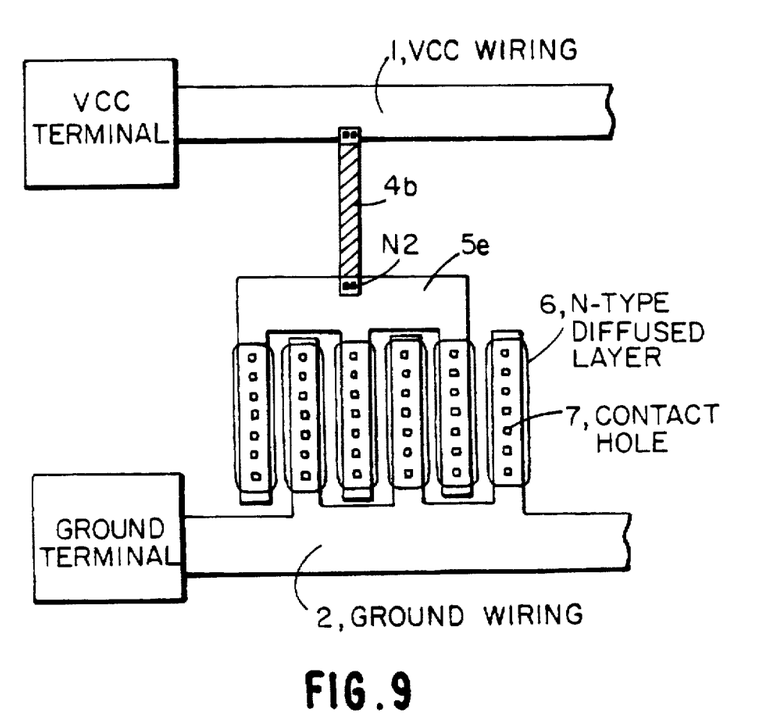
FIG. 9 is a diagram showing a specific example of the plane pattern in FIG. 8.

Referring to FIG. 9, a specific example of the circuit shown in FIG. 8 will be described. The node N2 situated almost at the central part of an aluminum wiring 5e which connects in common one ends of a plurality of protective elements (3-1, 3-2 and 3-3) is connected to the Vcc wiring 1 via a wiring 4b. The wiring 4b is formed of tungsten. Since the resistance of tungsten is about three times as high the resistance of aluminum, a tungsten wire with a length of 20 to 30 μm suffices to function as a resistor. Needless to mention, this resistance part may be formed of tungsten silicide as in FIG. 5. Since the aluminum wiring 5e is formed with a large width of about 20 μm, dispersion of the resistances of the wiring portions for the elements 1-3 can be made small.

Figure 10:
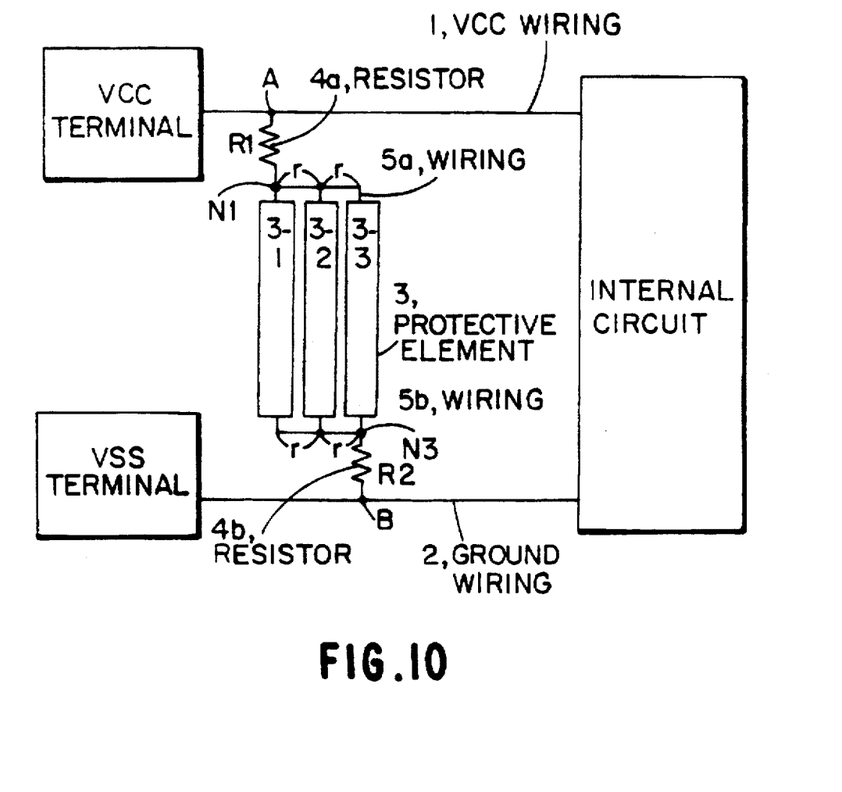
FIG. 10 is a circuit diagram showing a third embodiment of this invention.

Referring to FIG. 10, the third embodiment of this invention will be described. The difference of this embodiment from the first embodiment in FIG. 4 resides in the point that a resistor 4b is inserted between Gnd wiring 2 and a node N3 where the other ends of respective protective elements (3-1, 3-2 and 3-3) are connected in common. What is important here is the fact that the node N1 is formed in the vicinity of the protective element 3-1 while the node N3 is formed in the vicinity of the protective element 3-3. In FIG. 10, if Ron represents the on-resistance of each protective element, R1 the resistance of the resistor 4a, R2 the resistance of the resistor 4b, and r the wiring resistance of the aluminum wirings 5a and 5b between adjacent pairs of the protective elements, then the resistances of the paths between point A and point B through respective protective elements are all equal to R1+2r+R2+Ron.

With this configuration, the discharge currents that flow in the respective protective elements can be made equal even when the wiring resistance is taken into account provided that there is no dispersion in the on-resistance of the protective elements. Besides, due to the presence of the resistors 4a and 4b, the effect of the dispersion of the on-resistance among the protective elements, even if it exists, can be made small similar to the first embodiment in FIG. 4.

Figure 11:
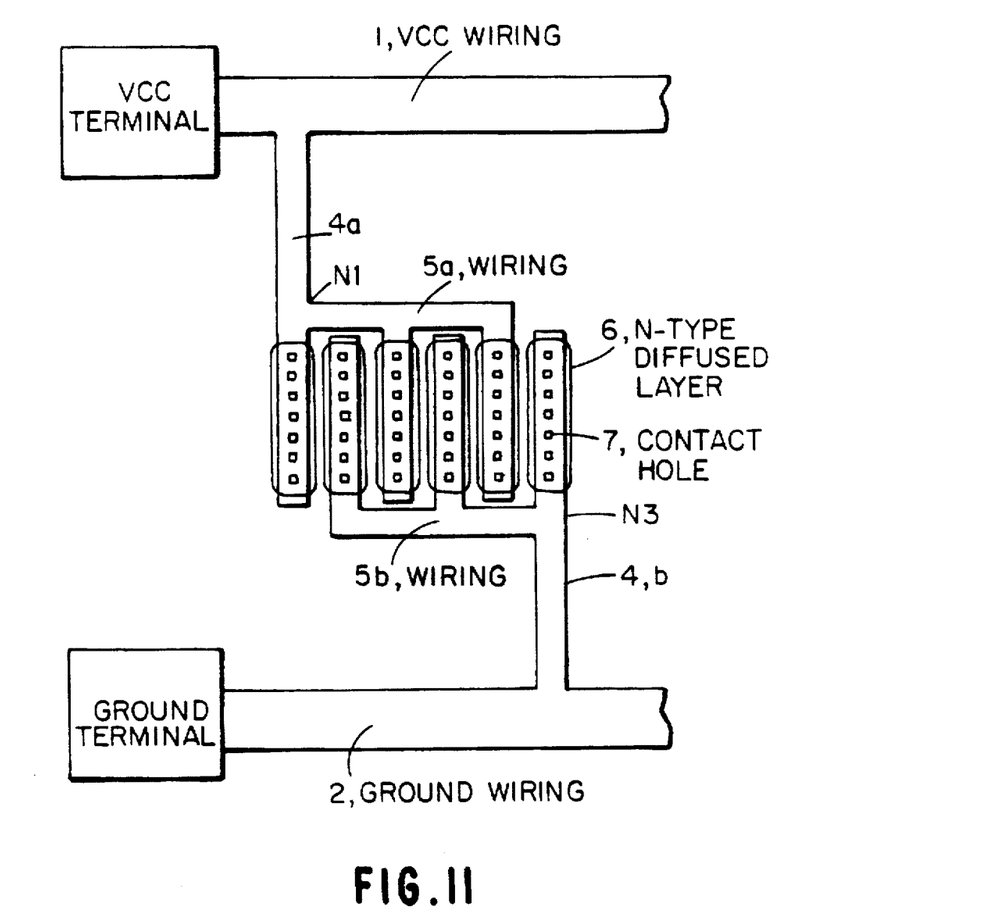
FIG. 11 is a diagram showing a first specific example of the plane pattern in FIG. 10.

Referring to FIG. 11, a specific example of the circuit shown in FIG. 10 will be described. One end (the left end in the figure) N1 of the aluminum wiring 5a which connects in common one ends of respective members of a plurality of protective elements (3-1, 3-2 and 3-3) is connected to the Vcc wiring 1 via the wiring 4a. Further, one end (the right end in the figure) N3 of the aluminum wiring 5b which connects in common the other ends of respective members of the plurality of protective elements (3-1, 3-2 and 3-3) is connected to the Gnd wiring 2 via the wiring 4b. The wirings 4a and 4b are formed of aluminum. The length of the wirings 4a and 4b is 60 μm so that their resistance is about 0.4 Ω each. Therefore, they can safely function as resistive elements.

Figure 12:
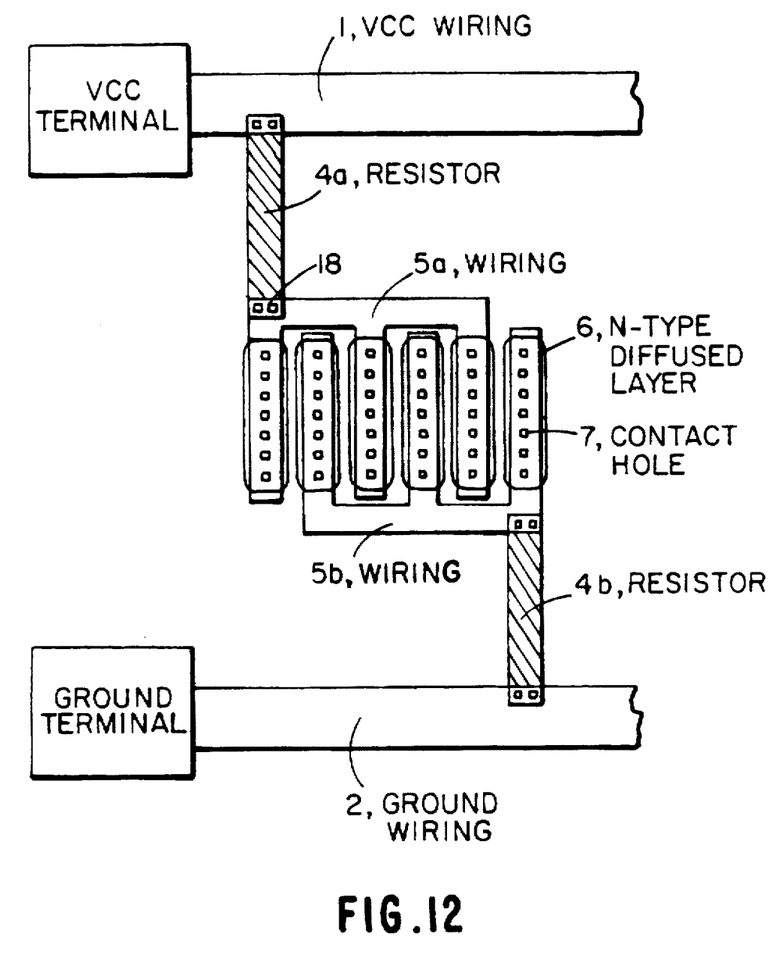
FIG. 12 is a diagram showing a second specific example of the plane pattern in FIG. 10.

FIG. 12 is an example in which the wirings 4a and 4b in FIG. 11 are formed of tungsten. Since the tungsten wirings are formed on the layer below that of the aluminum wirings, they are connected to the aluminum wirings by means of contact holes 18.

In the embodiments described in the above, reference has been made to the case of using a parasitic bipolar transistor as the protective element. However, the present invention is not limited to that case only, and can also be applied to the case of using, for example, a diode, a thyristor, or a MOS transistor protective element in which the gate is connected to the Gnd wiring and the source and the drain are connected to the Vcc wiring, for the protection circuit.

Although the invention has been described with reference to specific embodiments, this description is not meant to be construed in a limiting sense. Various modifications of the disclosed embodiments will become, apparent to persons skilled in the art upon reference to the description of the invention. It is therefore contemplated that the appended claims will cover any modifications or embodiments as fall within the true scope of the invention.

What is claimed is:

1. A semiconductor device comprising, a first power supply wiring, a second power supply wiring, a first, a second and a third protective elements arranged in parallel, a first connecting wiring connecting in common one ends of said first, said second and said third protective elements, a second connecting wiring connecting the other ends of said first, said second and said third protective elements to said second power supply wiring, and a third connecting wiring connecting said first connecting wiring to said first power supply wiring, where said third connecting wiring has a resistance higher than that of said first connecting wiring.

2. A semiconductor device as claimed in claim 1 wherein said first power supply wiring, said second power supply wiring, said first connecting wiring and said second connecting wiring are aluminum wirings, and said third connecting wiring is a wiring at least a part thereof is formed of a wiring material having a resistance higher than aluminum.

3. A semiconductor device as claimed in claim 1, wherein said first power supply wiring, said second power supply wiring, said first connecting wiring, said second connecting wiring and said third connecting wiring are wirings formed of an identical material, and the wiring length of said third connecting wiring is longer than the wiring length of said first connecting wiring.

* * * * *